US008493796B2

United States Patent
Higashi et al.

(10) Patent No.: US 8,493,796 B2
(45) Date of Patent: Jul. 23, 2013

(54) NONVOLATILE SEMICONDUCTOR MEMORY DEVICE

(75) Inventors: Tomoki Higashi, Yokohama (JP); Kazumi Tanimoto, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 13/239,490

(22) Filed: Sep. 22, 2011

(65) Prior Publication Data

US 2012/0134212 A1    May 31, 2012

(30) Foreign Application Priority Data

Nov. 30, 2010   (JP) ................................ 2010-266391

(51) Int. Cl.
- *G11C 11/34* (2006.01)
- *G11C 16/04* (2006.01)
- *G11C 16/06* (2006.01)

(52) U.S. Cl.
  USPC ............ 365/185.28; 365/185.17; 365/185.19; 365/185.22

(58) Field of Classification Search
  USPC ............ 365/185.17, 185.19, 185.22, 185.24, 365/185.28
  See application file for complete search history.

(56) References Cited

U.S. PATENT DOCUMENTS

| | | | |
|---|---|---|---|
| 6,894,931 B2 | 5/2005 | Yaegashi et al. | |
| 7,057,936 B2 | 6/2006 | Yaegashi et al. | |
| 7,116,581 B2 * | 10/2006 | Suzuki et al. | 365/185.19 |
| 7,656,710 B1 * | 2/2010 | Wong | 365/185.19 |

FOREIGN PATENT DOCUMENTS

JP    2009-301621    12/2009

* cited by examiner

*Primary Examiner* — Ly D Pham

(74) *Attorney, Agent, or Firm* — Oblon, Spivak, McClelland, Maier & Neustadt, L.L.P.

(57) ABSTRACT

A nonvolatile semiconductor memory device according to an embodiment of the present invention includes: a memory cell array having a plurality of memory cells arranged therein, each of the memory cells having a charge storage layer and a control electrode; and a control unit configured to execute a write cycle multiple times, the write cycle including a write operation and a write verify operation, the write operation being an operation for applying a write pulse voltage multiple times to the control electrode selected for data write, and the write verify operation being an operation for determining whether data write is completed or not. During one time of the write operation, the control unit makes a voltage value of a finally applied write pulse voltage larger than a voltage value of an initially applied write pulse voltage.

6 Claims, 14 Drawing Sheets

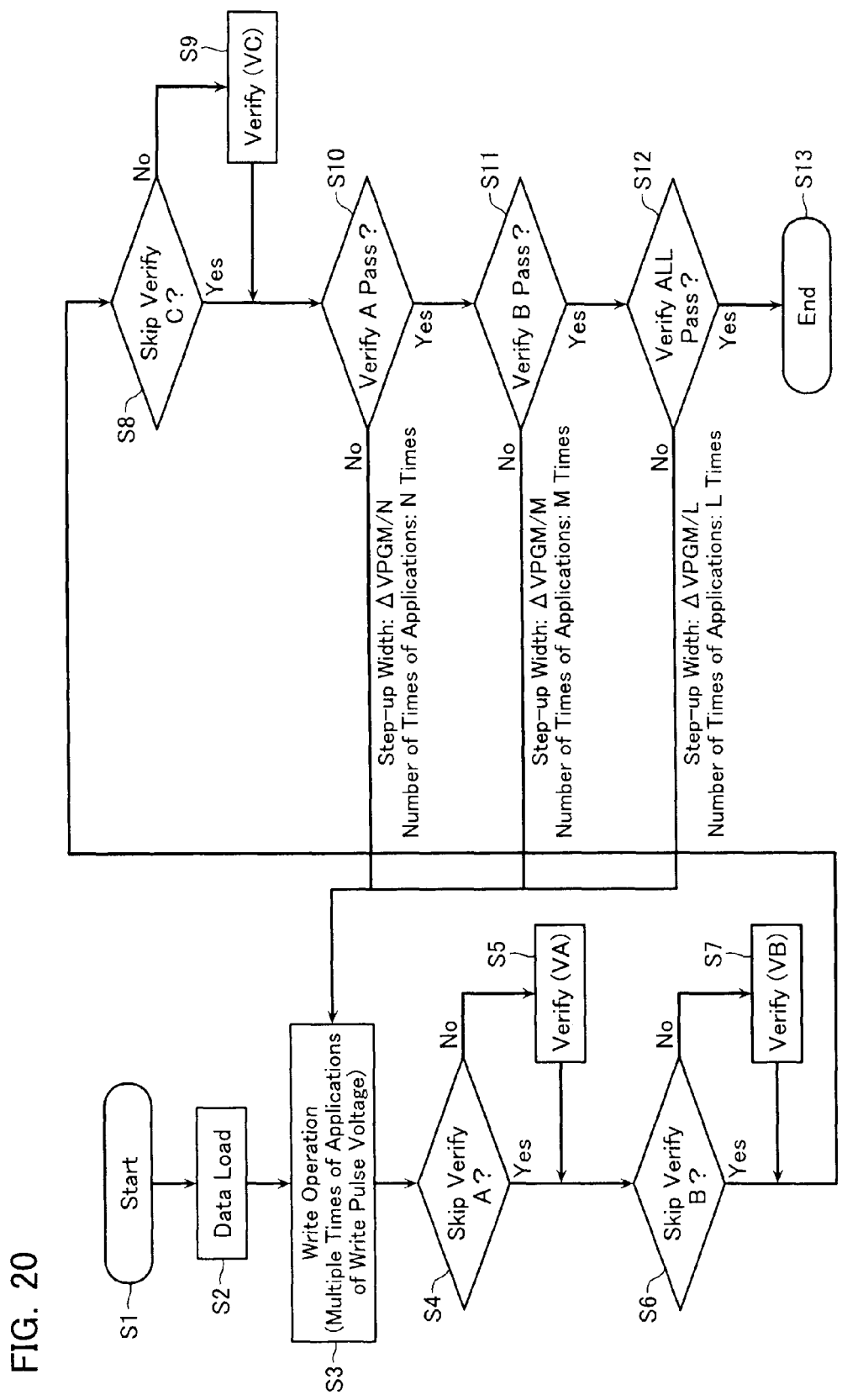

NONVOLATILE SEMICONDUCTOR MEMORY DEVICE

CROSS REFERENCE TO RELATED APPLICATION

This application is based upon and claims the benefit of priority from prior Japanese Patent Application No. 2010-266391, filed on Nov. 30, 2010, the entire contents of which are incorporated herein by reference.

BACKGROUND

1. Field

Embodiments described in the present specification relate to an electrically rewritable nonvolatile semiconductor memory device.

2. Description of the Related Art

In a nonvolatile semiconductor memory device having a charge storage layer which is a floating gate or some other SONOS type or MONOS type charge storage layer, data is stored by retaining charges (electrons or holes) in the charge storage layer. The threshold voltage of the memory cell transistor changes due to the quantity of retained charges, hence data can be determined by applying an intermediate voltage around that at which the threshold voltage changes as a gate voltage of the memory transistor and seeing whether the memory transistor becomes conductive or not. In this kind of nonvolatile semiconductor memory device, data write and erase is performed by a tunnel current from the semiconductor substrate or control gate due to a high electric field, or hot carriers generated from the semiconductor substrate.

Incidentally, when a write and erase operation is performed repeatedly on one memory cell, an insulating film of the memory cell suffers damage due to the charges passing through it, and is thereby gradually degraded. Electron traps and hole traps are generated within a degraded insulating film and charges are retained in these electron traps and hole traps similarly to in the charge storage layer in a floating gate electrode or the like. As a result, during information (data) retention, the memory cell retains charges in both the charge storage layer and the traps within the insulating film. This charges retained in the traps differs from the charges retained in the charge storage layer in not being assumed to be retained after the write operation. As a result, the charges retained in the traps exert a large effect on write characteristics of the cell.

As miniaturization of memory cells advances, the amount of charges required to cause threshold voltage change in the memory cell is reduced. That is, along with miniaturization, threshold voltage changes resulting from whether one electron trap is trapping electron or not also become significant. Particularly in multi-value memory where two bits or more of information is stored in one memory cell, threshold voltage is required to be controlled within a narrow threshold voltage distribution range, resulting in the need to suppress effects due to charges retained in the traps.

BRIEF DESCRIPTION OF THE DRAWINGS

FIG. 20 is a flowchart explaining operation of the nonvolatile semiconductor memory device according to the fifth embodiment.

DETAILED DESCRIPTION

A nonvolatile semiconductor memory device according to an embodiment of the present invention includes: a memory cell array having a plurality of memory cells arranged therein, each of the memory cells having a charge storage layer formed on a channel region of a semiconductor substrate via a first insulating film, and a control electrode formed on the charge storage layer via a second insulating film; and a control unit configured to execute a write cycle multiple times, the write cycle including a write operation and a write verify operation, the write operation being an operation for applying a write pulse voltage multiple times to the control electrode selected for data write, and the write verify operation being an operation for determining whether data write is completed or not. During one time of the write operation, the control unit makes a voltage value of a finally applied write pulse voltage larger than a voltage value of an initially applied write pulse voltage.

Next, embodiments of the present invention are described in detail with reference to the drawings.

First Embodiment

Figure 1:
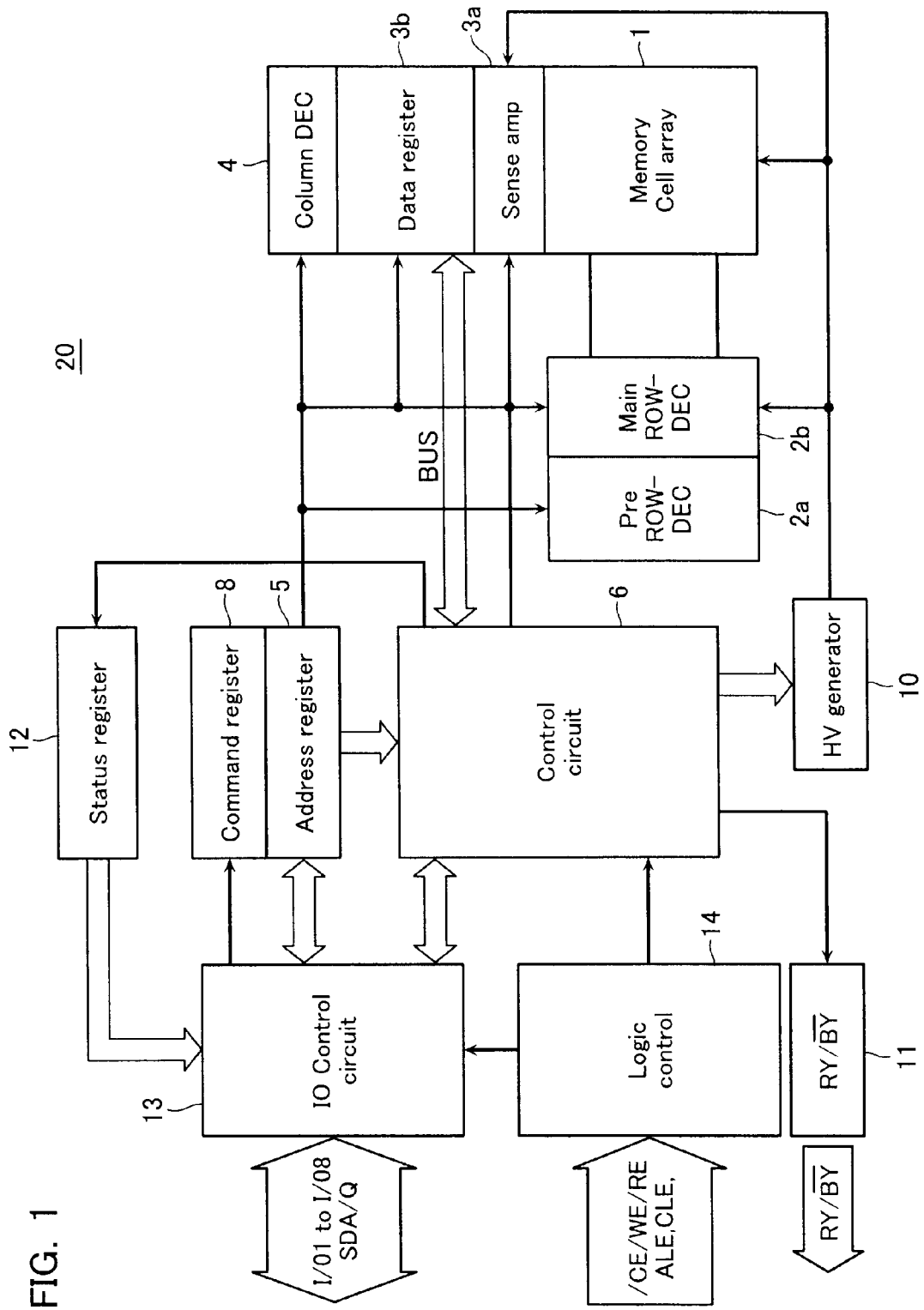
FIG. 1 is a block diagram showing a configuration of a nonvolatile semiconductor memory device according to a first embodiment.

First, a semiconductor memory device according to a first embodiment of the present invention is described with reference to FIG. 1 and so on. FIG. 1 is a block diagram showing a configuration of a nonvolatile semiconductor memory device according to a first embodiment in which the present invention is applied to a NAND type flash memory. As shown in FIG. 1, a NAND type flash memory 20 includes a memory cell array 1 having a plurality of memory cells arranged in a matrix therein, each of the memory cells including a floating gate acting as a charge storage layer. Disposed on a side portion of the memory cell array 1 in a bit line direction is a sense amplifier circuit 3 provided for read and write of cell data via bit lines. Disposed on another side portion of the memory cell array 1 is a row decoder circuit 2 that performs selection and drive of word lines and select gate lines. The row decoder circuit 2 comprises a pre row decoder 2a and a main row decoder 2b, and the sense amplifier circuit 3 comprises a sense amplifier 3a and a data register 3b.

Commands, addresses, and data are inputted via an input/output control circuit 13. A chip enable signal/CE, write enable signal/WE, read enable signal/RE and other external control signals are inputted to a logic circuit 14, and employed in timing control. Commands are decoded in a command register 8.

A control circuit 6 performs transfer control of data and sequence control of write/erase/read of data. The control circuit 6 outputs a Ready/Busy state of the NAND type flash memory 20 to a Ready/Busy terminal 11. In addition, a status register 12 is provided which informs a host of a state (Pass/Fail, Ready/Busy, and so on) of the NAND type flash memory 20 via the input/output control circuit 13.

Addresses are transferred to the row decoder circuit 2 or a column decoder 4 via an address register 5. Write data is loaded into the sense amplifier circuit 3 via the input/output control circuit 13, the control circuit 6, and a data bus BUS, and read data is outputted to external via the control circuit 6. A high voltage generating circuit 10 is provided for generating a high voltage required according to each operation mode. The high voltage generating circuit 10 generates certain high voltages such as a write pulse voltage based on instructions provided from the control circuit 6.

[Configuration of Memory Cell Array 1]

Figure 2:
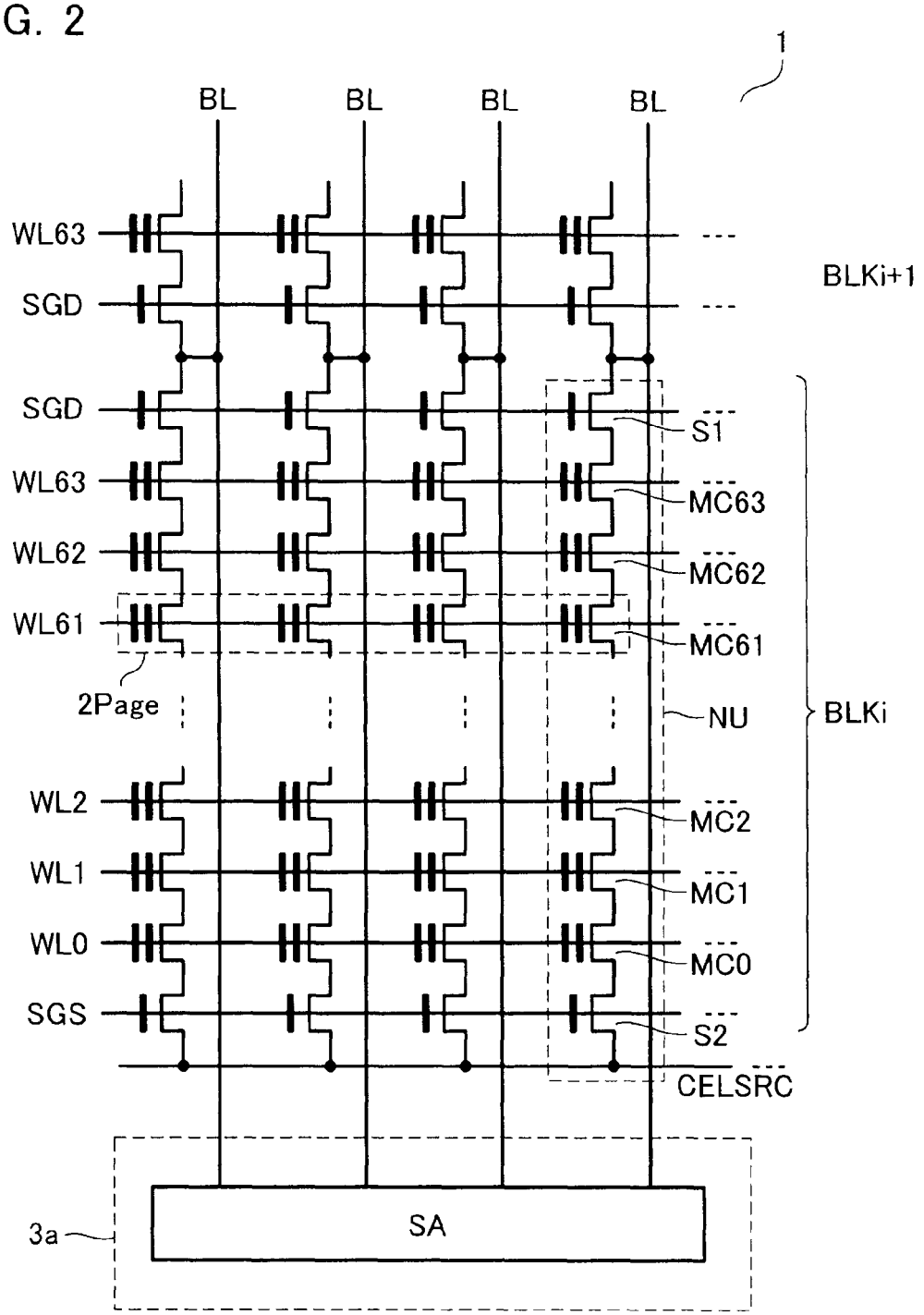
FIG. 2 is a circuit diagram showing a configuration of a memory cell array in the nonvolatile semiconductor memory device according to the first embodiment.

FIG. 2 is a circuit diagram showing a configuration of the memory cell array 1 in the present embodiment. As shown in FIG. 2, the memory cell array 1 is configured having NAND cell units NU arranged therein. Each of the NAND cell units NU includes a NAND string and select gate transistors S1 and S2 connected respectively to the two ends of the NAND string. The NAND string has a plurality of electrically rewritable nonvolatile memory cells (in the example of FIG. 2, 64 memory cells) MC0-MC63 connected in series.

One end (select gate transistor S1 side) of the NAND cell unit NU is connected to the bit line BL, and the other end (select gate transistor S2 side) is connected to a common source line CELSRC. Gate electrodes of the select gate transistors S1 and S2 are connected to select gate lines SGD and SGS. In addition, control gate electrodes of the memory cells MC0-MC63 are connected to word lines WL0-WL63, respectively. The bit lines BL are connected to the sense amplifier 3a, and the word lines WL0-WL63 and select gate lines SGD and SGS are connected to the row decoder circuit 2 (not illustrated in FIG. 2).

When one bit of data is stored in one memory cell MC (one bit per cell), one page of data is stored by the memory cells MC formed along one word line WL intersecting the NAND cell units NU. Moreover, when two bits of data are stored in one memory cell MC (two bits per cell), two pages (upper page UPPER, and lower page LOWER) of data are stored by the memory cells MC formed along one word line WL.

One block BLK is formed by the plurality of NAND cell units NU sharing the word lines WL. One block BLK forms one unit of a data erase operation. The number of word lines WL in one block BLK in one memory cell array 1 is 64, whereby the number of pages in one block is 64×2=128.

[Configuration of Memory Cell MC and Select Gate Transistors S1 and S2]

Figure 3:
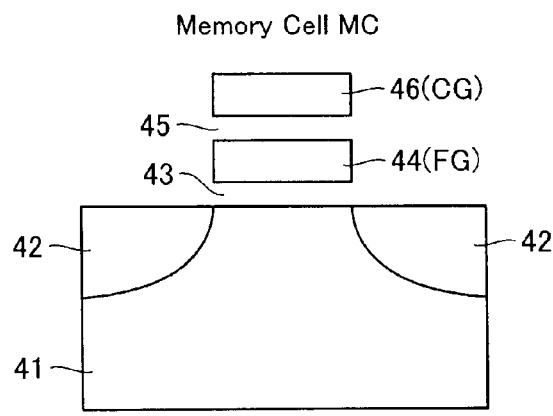
FIG. 3 is a cross-sectional view showing a configuration of a memory cell in the nonvolatile semiconductor memory device according to the first embodiment.
Figure 4:
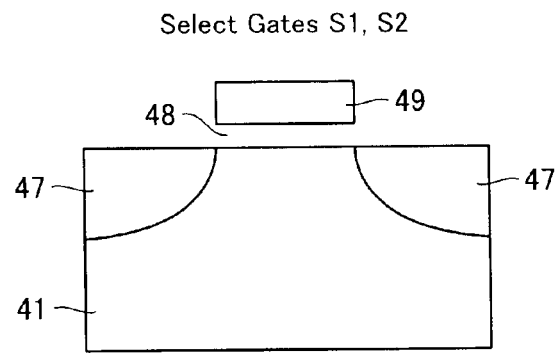
FIG. 4 is a cross-sectional view showing a configuration of a select transistor in the nonvolatile semiconductor memory device according to the first embodiment.

FIGS. 3 and 4 show a cross-sectional structure of the memory cell MC and the select gate transistors S1 and S2, respectively. As shown in FIG. 3, formed on a substrate 41 are n type diffusion layers 42 that function as a source and a drain of a MOSFET configuring the memory cell MC. Moreover, formed above the substrate 41 via a tunnel insulating film 43 is a floating gate electrode (FG) 44, and formed above this floating gate electrode 44 via an inter-gate insulating film 45 is a control gate electrode (CG) 46.

As shown in FIG. 4, the select gate transistors S1 and S2 comprise the substrate 41 and n type diffusion layers 47 that are formed on this substrate 41 and function as a source and a drain. Formed above the substrate 41 via a gate insulating film 48 is a control gate electrode 49.

[NAND Cell Unit NU]

Figure 5:
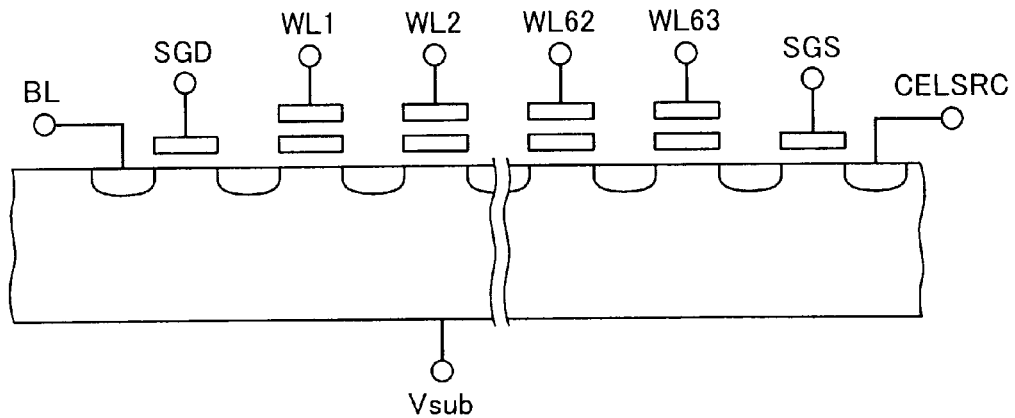
FIG. 5 is a cross-sectional view showing a configuration of a NAND cell unit in the nonvolatile semiconductor memory device according to the first embodiment.

FIG. 5 is a cross-sectional view showing a configuration of one NAND cell unit NU in the memory cell array 1. In the present embodiment, one NAND cell unit NU is configured by 64 memory cells MC of the configuration shown in FIG. 3 connected in series. Provided at ends of a drain side and a source side of the NAND cell unit NU are, respectively, the select gate transistors S1 and S2 of the configuration shown in FIG. 4.

The embodiments below are described adopting the example of the memory cell MC including the floating gate electrode described using FIGS. 3 through 5. However, the present invention may also be applied to a MONOS type (or SONGS type) memory cell MC employing an ONO film or the like as the charge storage layer in place of the floating gate electrode.

Figure 6:
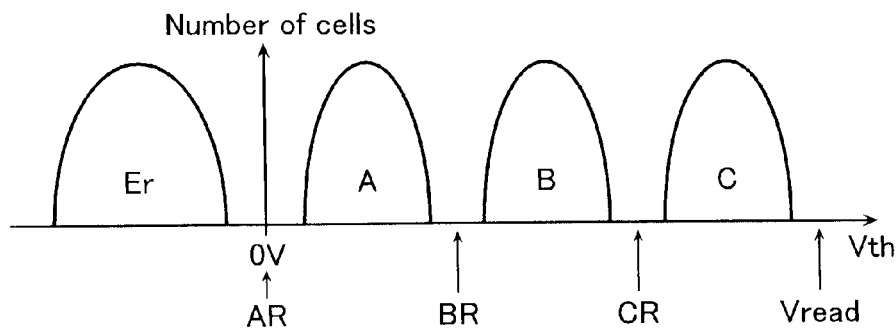
FIG. 6 is a view showing threshold voltage distributions in the nonvolatile semiconductor memory device according to the first embodiment.

Next, data storage states of the NAND type flash memory in the present embodiment are described referring to FIG. 6. FIG. 6 is a view showing threshold voltage distributions of the memory cell MC in the NAND type flash memory of the present embodiment.

In the present embodiment, the memory cell MC in the NAND type flash memory is assumed to store, for example, four-value data (two bits per cell). In this case, the threshold voltage distributions of data become as in FIG. 6. Four kinds of threshold voltage distributions (namely, Er, A, B, and C, in order of increasing threshold voltage) are provided. Allocated to these threshold voltage distributions are four kinds of data, namely "11", "01", "00", and "10". Data herein is expressed by upper page data and lower page data. Note that the threshold voltage distribution Er is a negative threshold voltage state obtained by a batch block erase.

In a data read operation in the NAND type flash memory, unselected word lines WL in the memory cell array 1 are applied with a read pass voltage Vread that causes the unselected memory cell MC to be conductive irrespective of data. Note that the pass voltage Vread applied to each of the unselected memory cells MC may differ.

During the read operation of four-value data, a voltage value of the voltage applied to a selected word line WL is set to voltages AR, BR, or CR between each of the threshold voltage distributions, corresponding to the four kinds of threshold voltage distributions of the selected memory cell MC. The voltage AR is the lowest voltage, and the voltages increase in the order of BR and CR. During the read operation of four-value data, data read is executed by detecting whether a current flows in the NAND cell unit NU at the time of each of the voltages AR, BR, and CR, or not.

A data erase operation in the NAND type flash memory is executed on a block BLK basis. The data erase operation is performed by setting all word lines WL in a selected block BLK to 0 V, and applying a positive boosted erase voltage (for example, 18 V-20 V) to a P type well where the memory cell array 1 is formed. This results in a negative threshold voltage state (erase state) being obtained due to electrons in the floating gate electrode in all memory cells MC in the selected block BLK being released.

[Write Operation]

Figure 7:
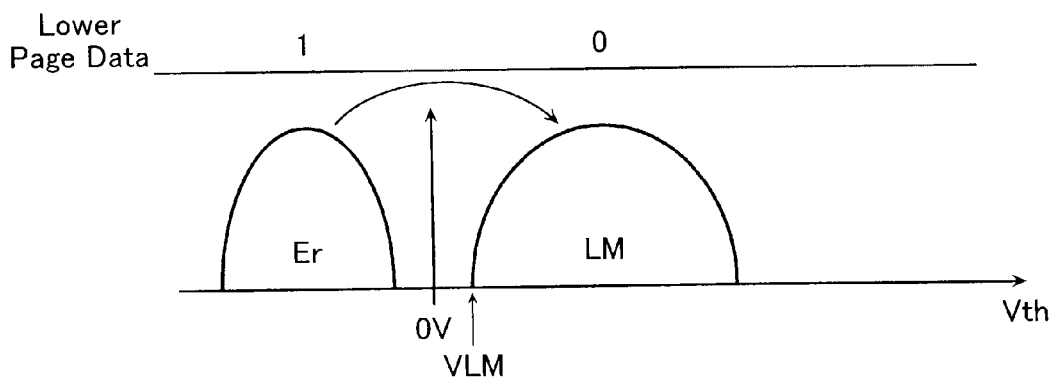
FIG. 7 is a view explaining a write operation in the nonvolatile semiconductor memory device according to the first embodiment.
Figure 8:
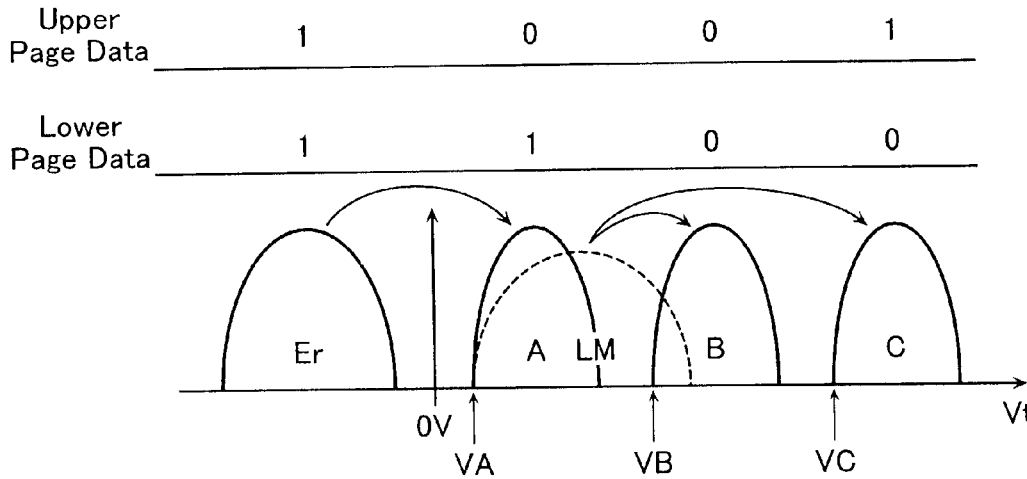
FIG. 8 is a view explaining the write operation in the nonvolatile semiconductor memory device according to the first embodiment.

Next, a data write operation in the nonvolatile semiconductor memory device according to the present embodiment is described. FIGS. 7 and 8 are views showing the data write operation in the case of the four-value data storage system in the NAND type flash memory according to the present embodiment.

In order to write four-value data, first, all memory cells MC in a selected block BLK are set to the negative threshold voltage distribution Er by the above-mentioned erase operation. Next, as shown in FIG. 7, a lower page write, in which some of the memory cells MC having the threshold voltage distribution Er are written to an intermediate level LM between the threshold voltage distributions A and B, is performed. Memory cells MC that undergo lower page write are memory cells MC in which lower page data is "0".

Subsequently, as shown in FIG. 8, the threshold voltage of memory cells MC to be written with data "01" is raised from the threshold voltage distribution Er to A. In addition, the threshold voltage of memory cells MC to be written with data "00" and "10" is raised from the intermediate level LM to, respectively, the threshold voltage distributions B and C. As a result, upper page write is performed.

During the above described data write operation, the bit line BL corresponding to the selected memory cell MC that is to have its threshold voltage distribution raised is applied with a voltage VSS. The voltage VSS is transferred to a channel of the selected memory cell MC via the drain side select gate transistor S1 that becomes conductive. In addition, the selected word line WL connected to the selected memory cell MC is applied with a write pulse voltage Vpgm (for example, 15 V-20 V). At this time, a large electric field is applied between the floating gate electrode and the channel in the selected memory cell MC, whereby electrons are injected from the channel into the floating gate electrode by FN tunneling. This causes the threshold voltage distribution of the selected memory cell MC to rise.

The bit line BL corresponding to a memory cell MC that is not to have its threshold voltage distribution raised is applied with a voltage VDD. The voltage VDD is transferred to a channel of the memory cell MC via the drain side select gate transistor S1 that becomes conductive. Subsequent to the channel being charged to the voltage VDD, the drain side select gate transistor S1 is rendered in a nonconductive state. When the channel of the selected memory cell MC is set to a floating state, even if the program voltage Vpgm is applied to the selected word line WL, a potential of the channel rises due to capacitive coupling with the selected word line WL, with the result that electrons are not injected into the floating gate electrode.

[Write Verify Operation]

As shown in FIG. 7, during lower page write (write of the intermediate level LM), verification of write state is performed by a verify voltage VLM corresponding to a lower limit of the threshold voltage distribution of that lower page write. That is, in a verify read operation applying the verify voltage VLM to the selected word line WL, a determination is performed that determines fail if the selected memory cell MC is conductive, and pass when the selected memory cell MC is nonconductive. Similarly, during upper page write, write verification of the threshold voltage distributions A, B, and C is performed by the verify voltages VA, VB, and VC, respectively, shown in FIG. 8.

In upper page write, since write is generally completed in order of increasing threshold voltage distribution, that is, in order of the threshold voltage distributions A, B, and C, it is also possible for only a write verify of the threshold voltage distribution A to be performed in an initial stage of a write cycle. Moreover, it is also possible to configure an operation that adds write verify of the threshold voltage distribution B after a certain timing, and after a further delay, adds write verify of the threshold voltage distribution C.

When it is detected by the write verify operation that the selected memory cell MC is written with a desired threshold voltage distribution, the selected memory cell MC is found to sufficiently undergo write operation, and the write operation is completed. If the selected memory cell MC is not written with the desired threshold voltage distribution, the write operation is performed again on the selected memory cell MC. When re-performing the write operation, the write pulse voltage Vpgm is stepped up an increment of a certain voltage, and the write operation is executed using that voltage after stepping up.

A step-up operation of the write pulse voltage Vpgm during an operation to sequentially write the threshold voltage distributions A, B, and C is described in detail below. In the description below, an upper page write operation in the write operation is described (refer to FIG. 8).

[Step-Up Operation]

Figure 9:
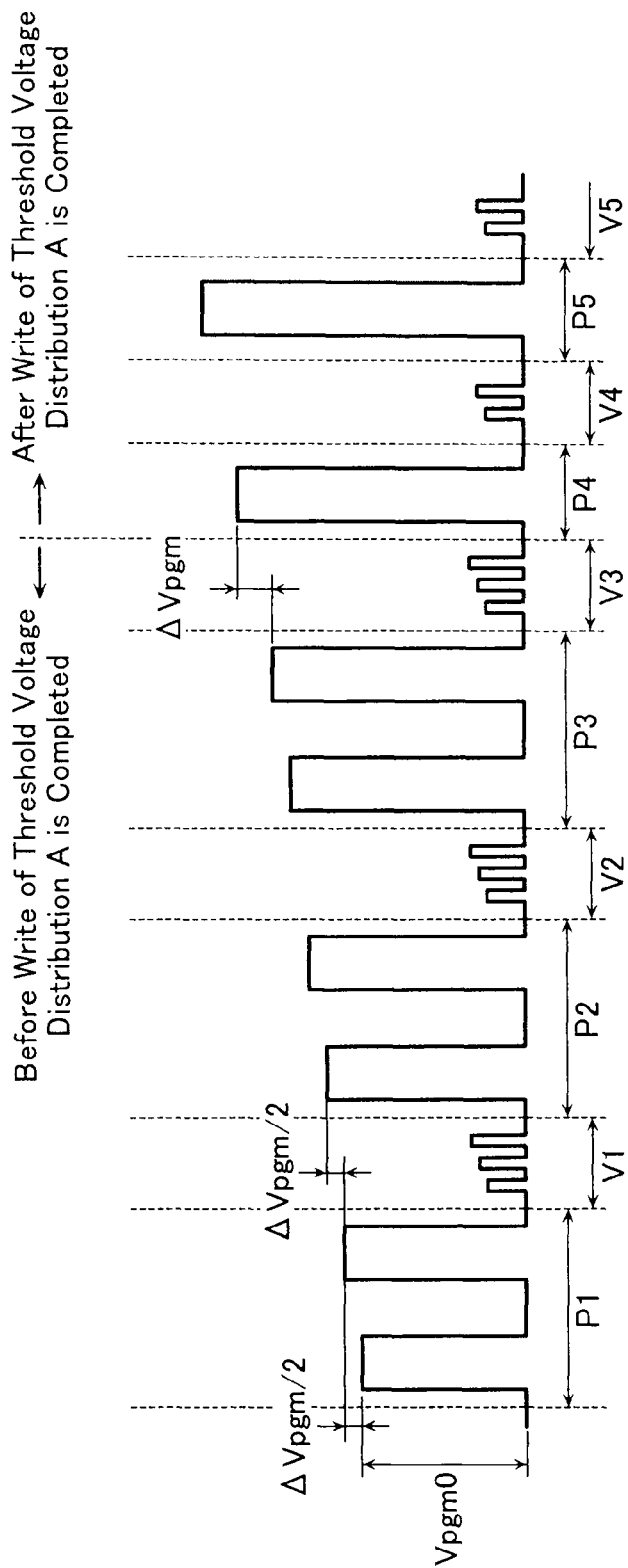
FIG. 9 is a view showing how a write pulse voltage is stepped up when a write cycle is repeated in the first embodiment.

FIG. 9 is a view showing how the write pulse voltage Vpgm is stepped up when a write operation is re-performed after a write verify operation. FIG. 9 is a view showing a state of the write pulse voltage Vpgm applied to the selected word line WL when the threshold voltage distribution A is written in the upper page write operation. In FIG. 9, time periods P1, P2, P3, P4, and P5 are time periods when the write operation is executed, and time periods V1, V2, V3, V4, and V5 are time periods when the verify operation is executed.

First, when starting the write operation in time period P1, the write pulse voltage Vpgm initially applied is set to an initial value Vpgm0. Now, in the present embodiment, the verify operation is performed not after each one time of application of the write pulse voltage Vpgm, but after multiple times (two times in the example shown in FIG. 9) of applications of the write pulse voltage Vpgm. A value of a second time of the write pulse voltage Vpgm in time period P1 is set to a voltage (Vpgm0+ΔVpgm/2) which is larger than the initial value Vpgm0 by an amount of half of a certain step-up value ΔVpgm (>0) (refer to FIG. 9).

Subsequently, in time period V1, a write verify operation to read whether the threshold voltage distribution A, B, or C is written or not is performed. When a write-insufficient memory cell MC exists, a step-up operation increasing the write pulse voltage Vpgm by a further amount of a voltage ΔVpgm/2 is performed.

When the write operation is executed in time period P2, the write pulse voltage Vpgm is set to a voltage Vpgm0+ΔVpgm. The difference in voltage between the write pulse voltage Vpgm initially applied in time period P1 and the write pulse voltage Vpgm initially applied in time period P2 is set to the certain step-up value ΔVpgm. The verify operation is performed after multiple times (two times in the example shown in FIG. 9) of applications of the write pulse voltage Vpgm also in time period P2. A second time of the write pulse voltage Vpgm in time period P2 is set to a voltage (Vpgm0+3·ΔVpgm/2) which is larger than the voltage Vpgm0+ΔVpgm by the amount of half of the certain step-up value ΔVpgm (>0) (refer to FIG. 9).

Thereafter, the write operation and write verify operation are repeated until data write is completed. In time periods P1, P2, and P3, the write pulse voltage Vpgm is applied multiple times and stepped up in increments of the voltage ΔVpgm/2.

In the write operations in time periods P4 and P5 after it is determined by the write verify operation of time period V3 that the threshold voltage distribution A is written to the selected memory cell MC, one time of the write pulse voltage Vpgm is applied. In time periods V4 and V5, a verify operation of another threshold voltage distribution (for example, threshold voltage distribution B or C) is executed. In write operations after it is determined that the threshold voltage distribution A is written to the selected memory cell MC, a step-up operation stepping up the write pulse voltage Vpgm by the certain step-up value ΔVpgm is performed.

[Advantages]

Figure 10:
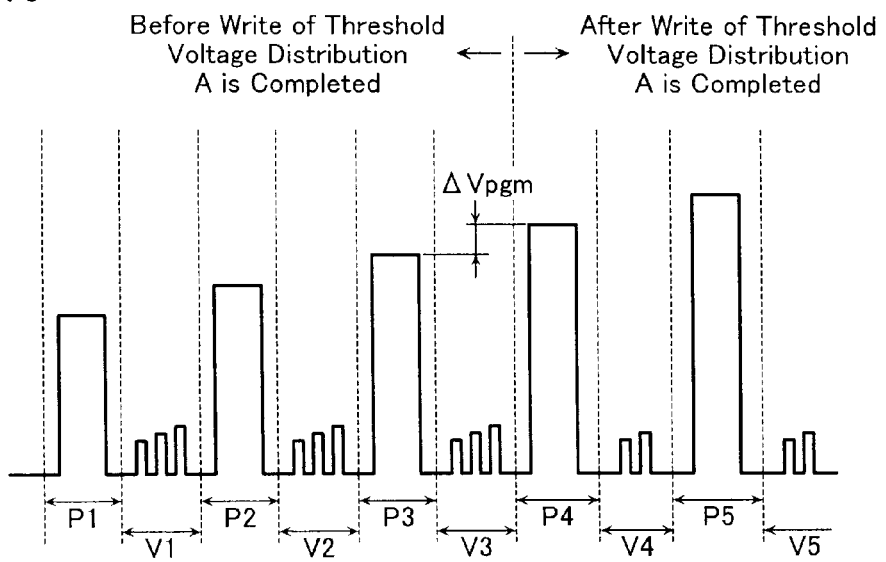
FIG. 10 is a view showing how a write pulse voltage is stepped up when a write cycle is repeated in a comparative example.

As described above, in the write operation of the present embodiment, in a time period of one time of the write operation, the write pulse voltage Vpgm is applied multiple times and a voltage value of each of the write pulse voltages Vpgm varies. Advantages of such a write operation are described by comparing with a write operation in a comparative example. FIG. 10 is a view showing how the write pulse voltage Vpgm is stepped up during a write operation in a comparative example. The write operation shown in FIG. 10 differs from the write operation of the embodiment shown in FIG. 9 in having only one time of the write pulse voltage Vpgm applied during each of the write operations of time periods P1-P5.

In the write operation in the comparative example, a verify operation is performed after one time of the write pulse voltage Vpgm is applied, to determine whether the selected memory cell MC attains the threshold voltage distribution set beforehand. When the threshold voltage of the selected memory cell MC does not attain a certain threshold voltage distribution, a write pulse is re-applied raising (stepping up) its voltage a little, and a verify operation is performed. Then, application of the write pulse voltage Vpgm and the verify operation are repeated until the threshold voltage of the selected memory cell MC reaches a setting level. Moreover, a selected memory cell MC of which the threshold voltage is determined to reach the setting level by the verify operation does not undergo write pulse application thereafter.

Figure 11:
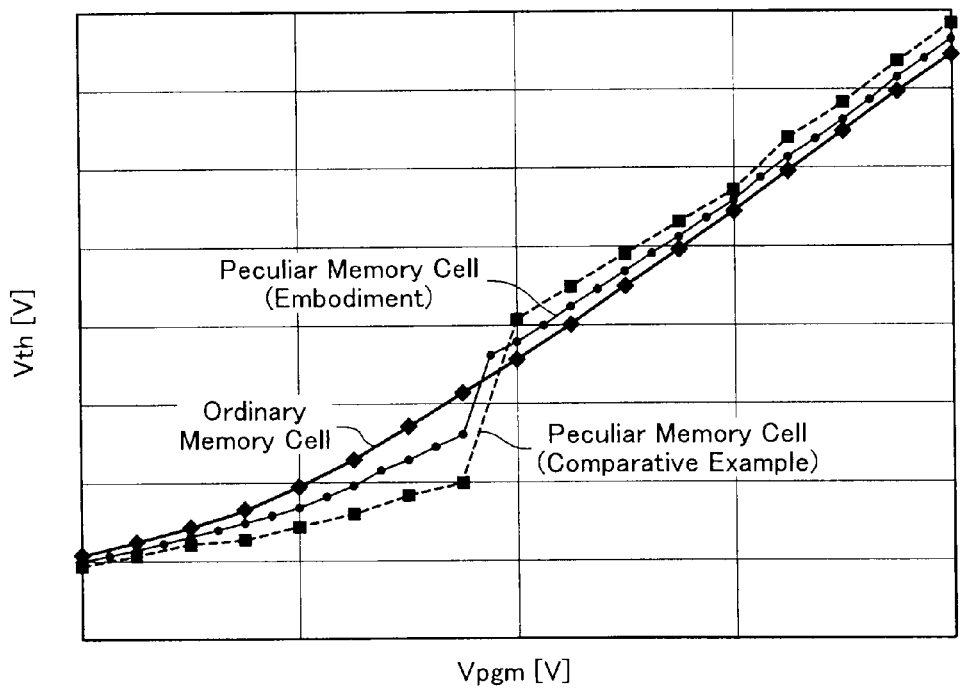
FIG. 11 is a view explaining advantages of the nonvolatile semiconductor memory device according to the first embodiment.

Ideally, employing the write operation of the comparative example ought to allow the threshold voltage distribution width to be suppressed to about the step-up amount of the write pulse voltage Vpgm. However, in reality, various factors cause the distribution width to broaden. One of those factors is that, in addition to an ordinary memory cell MC in which the threshold voltage rises with a constant speed in accordance with step-up of the write pulse voltage Vpgm, there exists a peculiar memory cell MC in which, subsequent to continuation of a state where almost no change in threshold voltage can be seen, the threshold voltage changes greatly. As shown in FIG. 11, the threshold voltage Vth of an ordinary memory cell MC rises with a substantially constant speed each time the voltage value of the write pulse voltage Vpgm is raised. However, in a certain peculiar memory cell MC, the threshold voltage Vth hardly rises even when the voltage value of the write pulse voltage Vpgm is raised, then when the write pulse voltage Vpgm reaches a certain value, the threshold voltage changes greatly. This phenomenon is considered to occur by normal movement of charge during the write operation being hindered due to the effect of traps generated by degradation of the tunnel insulating film and so on. Furthermore, this phenomenon is understood to occur more easily particularly when the threshold value of write data is low.

Figure 12:
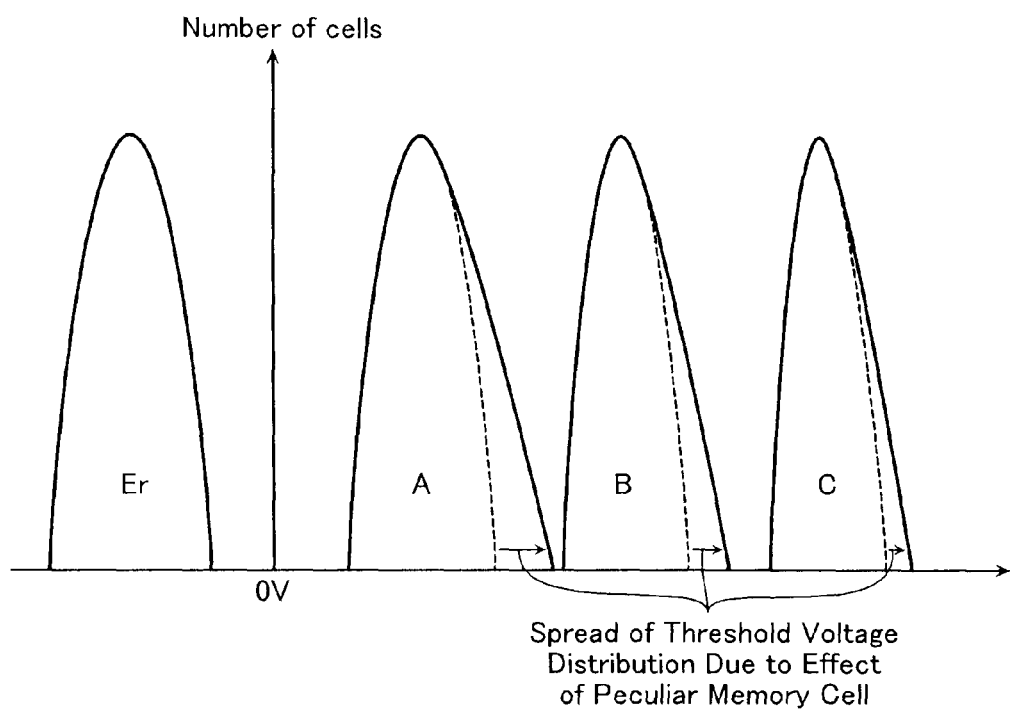
FIG. 12 is a view explaining advantages of the nonvolatile semiconductor memory device according to the first embodiment.

The occurrence of such a peculiar memory cell MC makes it difficult to accurately control a value of the threshold voltage of the memory cell MC during the write operation. FIG. 12 is a view showing threshold voltage distributions when executing a write operation on a semiconductor memory device that includes this peculiar memory cell MC. As mentioned above, in the peculiar memory cell MC, the value of the threshold voltage subsequent to the write operation rises greatly, with the result that, as shown in FIG. 12, an upper limit side of the threshold voltage distribution subsequent to the write operation spreads. If a spacing between the threshold voltage distributions narrows, setting of read voltage becomes difficult, leading by extension to a risk of erroneous read.

To deal with such a problem, the write operation in the present embodiment, when repeating a write cycle, that is, when repeating application of the write pulse voltage Vpgm and the verify operation, performs application of the write pulse voltage Vpgm multiple times while stepping up the voltage value, and then performs the verify operation. In the above-mentioned peculiar memory cell MC, normal movement of charge is hindered by the effect of traps generated in the tunnel insulating film and so on, whereby almost no change in the threshold voltage can be seen. However, applying the write pulse voltage Vpgm multiple times in succession to this peculiar memory cell MC while changing the voltage value allows a state of an electric field in the memory cell MC to be changed, allows factors hindering normal movement of charge to be eliminated, and allows creation of a state in which the threshold voltage rises with constant speed.

As shown in FIG. 11, executing the write operation of the present embodiment enables a significant rise in the threshold voltage to be prevented, even in the case of a peculiar memory cell MC. Therefore, the write operation in the present embodiment makes it possible to suppress the peculiar cell action that, subsequent to continuation of a state where almost no change in threshold voltage can be seen, the threshold voltage changes greatly, and suppress spread of the write threshold voltage distribution width.

Figure 13:
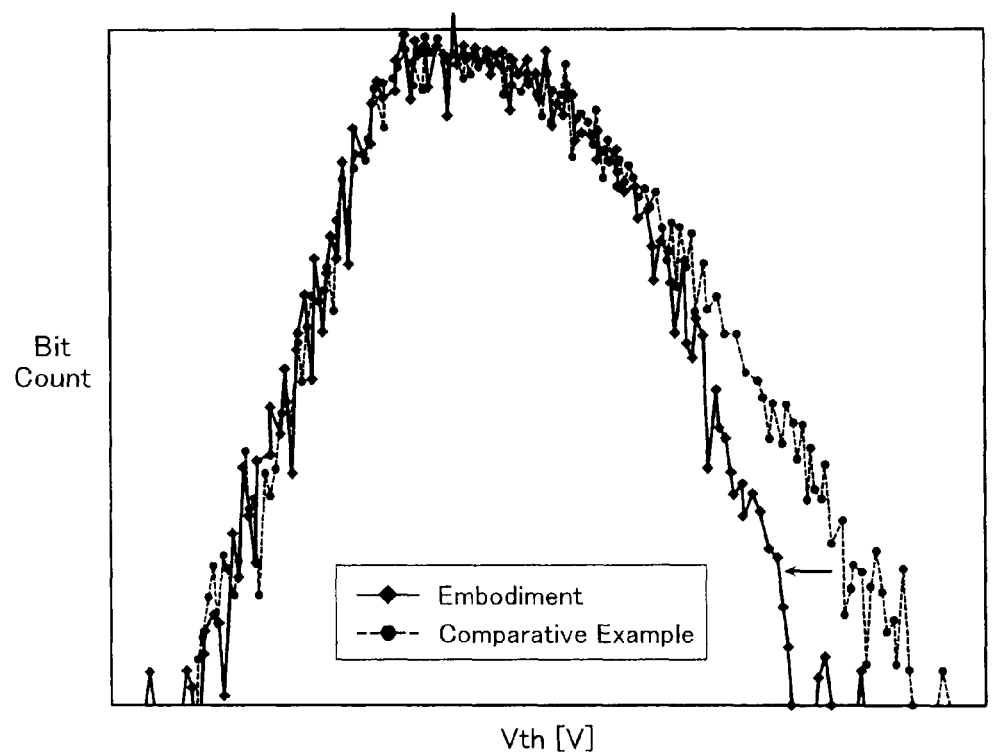
FIG. 13 is a view explaining advantages of the nonvolatile semiconductor memory device according to the first embodiment.
Figure 14:
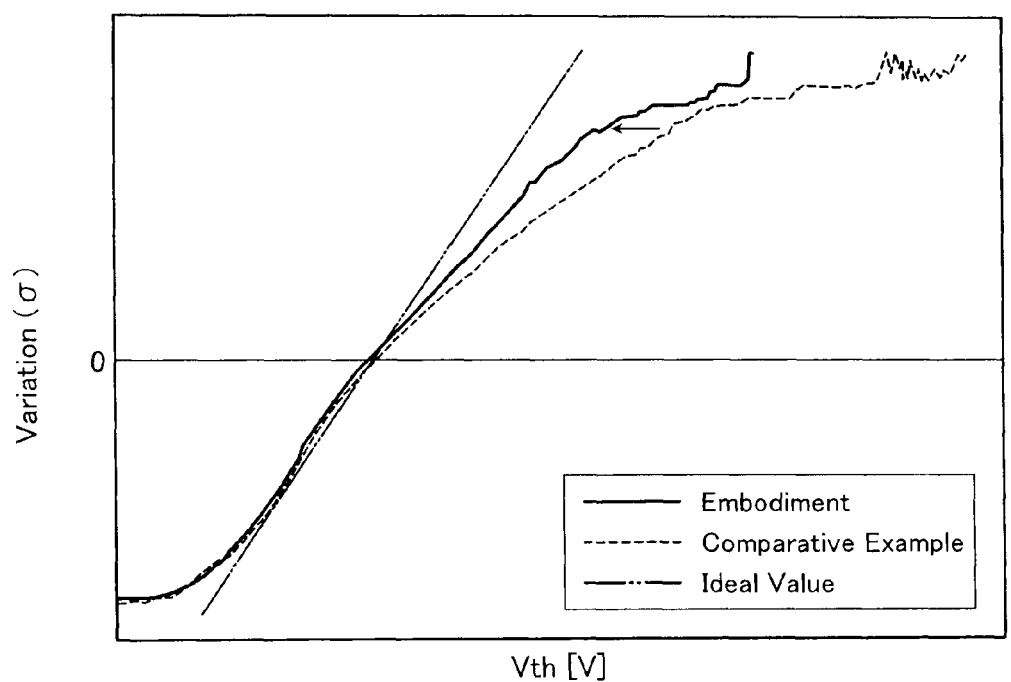
FIG. 14 is a view explaining advantages of the nonvolatile semiconductor memory device according to the first embodiment.

FIG. 13 is a view showing spread of the threshold voltage distribution in the case of executing, respectively, the write operation in the present embodiment and the write operation in the comparative example. FIG. 14 is a graph plotting the threshold voltage distributions shown in FIG. 13 about sigma. The graph of FIG. 14 shows what level the value of the threshold voltage is when variation has a certain value (for example, 3σ). The closer the graph is to an ideal value (straight line), the closer the threshold voltage distribution is to a normal distribution. As shown in FIGS. 13 and 14, as a result of the write operation according to the present embodiment, the width of the distribution is narrowed to approach a normal distribution. That is, the write operation in the present embodiment makes it possible to control the threshold voltage to within a narrow threshold voltage distribution and enables effects due to charge retained in traps to be suppressed.

Second Embodiment

Figure 15:
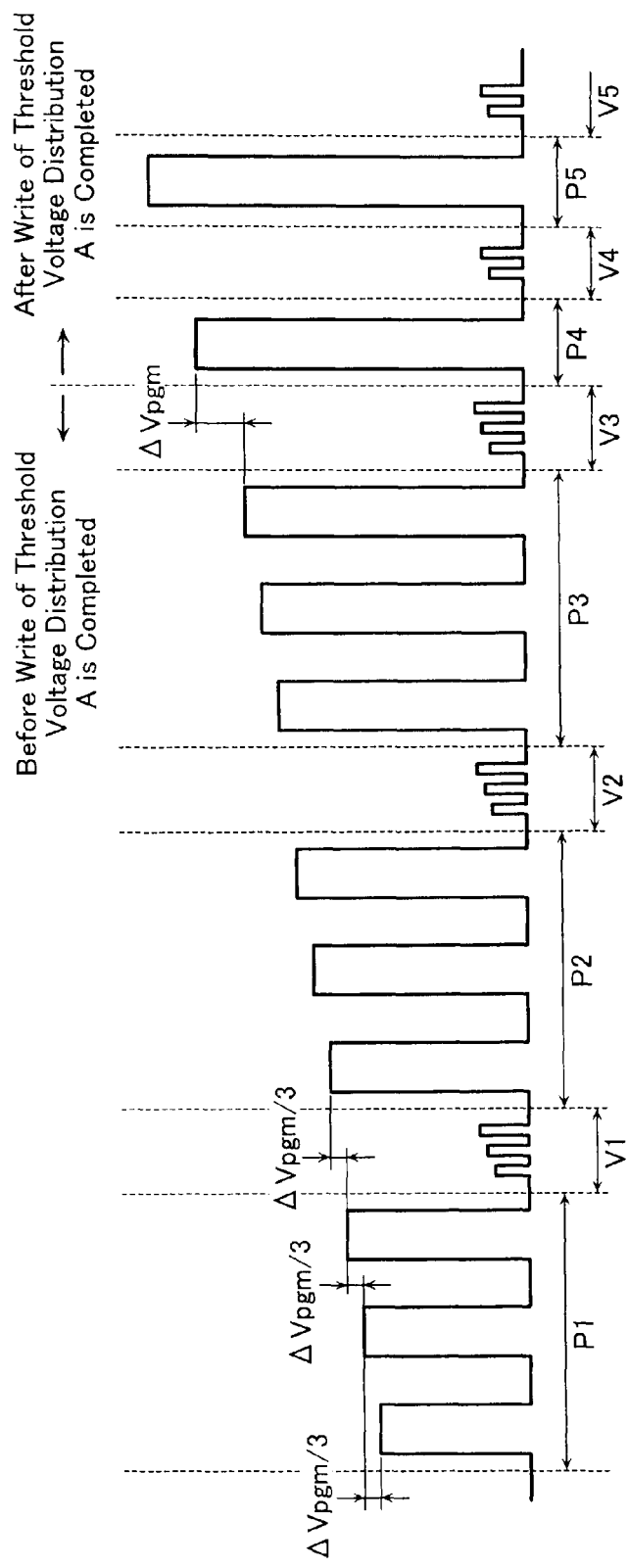
FIG. 15 is a view showing operation of a nonvolatile semiconductor memory device according to a second embodiment.

Next, a second embodiment of the present invention is described with reference to FIG. 15. A configuration of a nonvolatile semiconductor memory device in the present embodiment is similar to that in the first embodiment, hence detailed description thereof is omitted. FIG. 15 is a view showing a state of the write pulse voltage Vpgm applied to the selected word line WL when writing the threshold voltage distribution A in the upper page write operation. The present embodiment differs from the first embodiment in the number of times that the write pulse voltage Vpgm is applied during one time of the write operation, and in the step-up value of the write pulse voltage Vpgm.

As shown in FIG. 15, in the present embodiment, when performing one time of the write operation in time period P1, a verify operation is performed after three times of applications of the write pulse voltage Vpgm. Values of each of the write pulse voltages Vpgm in time period P1 are set to an initial value Vpgm0, and to voltages which are larger than the initial value Vpgm0 by increments of one third of a certain step-up value $\Delta$Vpgm (>0) (refer to FIG. 15).

Subsequently, in time period V1, a write verify operation to read whether the threshold voltage distribution A, B, or C is written or not is performed. When a write-insufficient memory cell MC exists, a step-up operation increasing the write pulse voltage Vpgm by a further amount of a voltage $\Delta$Vpgm/3 is performed.

When the write operation is executed in time period P2, the write pulse voltage Vpgm is set to a voltage Vpgm0+$\Delta$Vpgm. The difference in voltage between the write pulse voltage Vpgm initially applied in time period P1 and the write pulse voltage Vpgm initially applied in time period P2 is set to the certain step-up value $\Delta$Vpgm. The verify operation is performed after multiple times (three times in the example shown in FIG. 15) of applications of the write pulse voltage Vpgm also in time period P2. Values of the write pulse voltages Vpgm in time period P2 are set to voltages which are larger than the voltage Vpgm0+$\Delta$Vpgm by increments of one third of the certain step-up value $\Delta$Vpgm (>0) (refer to FIG. 15).

Thereafter, the write operation and write verify operation are repeated until data write is completed. In time periods P1, P2, and P3, the write pulse voltage Vpgm is applied multiple times and stepped up in increments of the voltage $\Delta$Vpgm/3.

In the write operations in time periods P4 and P5 after it is determined by the write verify operation of time period V3 that the threshold voltage distribution A is written to the selected memory cell MC, one time of the write pulse voltage Vpgm is applied. In time periods V4 and V5, a verify operation of another threshold voltage distribution (for example, threshold voltage distribution B or C) is executed. In write operations after it is determined that the threshold voltage distribution A is written to the selected memory cell MC, a step-up operation stepping up the write pulse voltage Vpgm by the certain step-up value $\Delta$Vpgm is performed.

[Advantages]

The write operation in the present embodiment, when repeating a write cycle, that is, when repeating application of the write pulse voltage Vpgm and the verify operation, also performs application of the write pulse voltage Vpgm multiple times while stepping up the voltage value, and then performs the verify operation. Executing the write operation of the present embodiment enables a significant rise in the threshold voltage to be prevented, even in the case of a peculiar memory cell MC. Therefore, the write operation in the present embodiment makes it possible to suppress the peculiar cell action that, subsequent to continuation of a state where almost no change in threshold voltage can be seen, the threshold voltage changes greatly, and suppress spread of the write threshold voltage distribution width.

In the above-mentioned embodiment, the write operation is executed setting the voltage values of the write pulse voltages Vpgm to values that differ from each other such that the voltage value becomes higher each time the multiple write pulse voltages Vpgm are applied. Now, in the first and second embodiments, there are, respectively, two times and three times of write pulse voltages Vpgm applied in the time period of one time of the write operation. This number of times of application of the write pulse voltage Vpgm can be set to any value.

Figure 16:
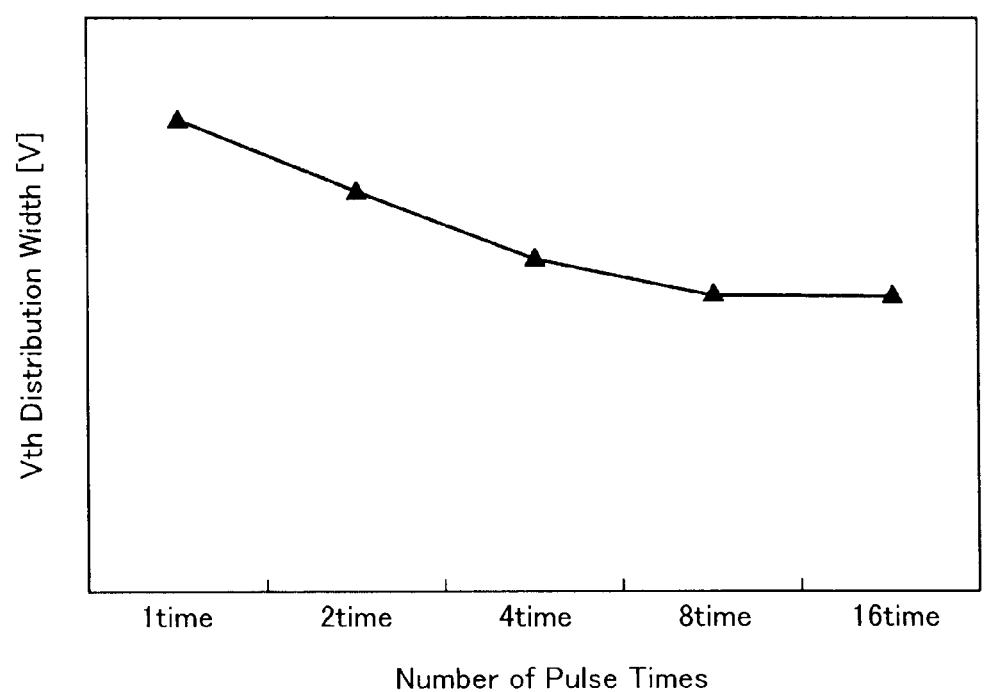
FIG. 16 is a view explaining advantages of the nonvolatile semiconductor memory device according to the second embodiment.

FIG. 16 is a graph showing the width of the threshold voltage distribution after the write operation when the number of times of write pulse voltages Vpgm applied in the time period of one time of the write operation is set to one time, two times, four times, eight times, and sixteen times. Now, the case where the number of times of write pulse voltages Vpgm applied in the time period of one time of the write operation is one time corresponds to the above-mentioned comparative example in the first embodiment. As shown in FIG. 16, the greater the number of times of write pulse voltages Vpgm applied in the time period of one time of the write operation, the more possible it is to suppress the peculiar cell action that the threshold voltage changes greatly, and suppress spread of the write threshold voltage distribution width. However, increasing the number of times of applications of the write pulse voltage Vpgm causes the time period of one time of the write operation to lengthen. Therefore, the number of times of applications of the write pulse voltage Vpgm can be set in view of the increase in write operation time due to the increase in number of times of applications of the write pulse voltage Vpgm and the spread of the threshold voltage distribution width after execution of the write operation. As shown in FIG. 16, although increasing the number of times of applications of the write pulse voltage Vpgm up to about eight times allows the threshold voltage distribution width to be reduced, when the number of times of applications reaches sixteen, there is almost no improvement in the threshold voltage distribution. It is thus preferable for the number of times of applications of the write pulse voltage Vpgm to be set to between two times and eight times.

Third Embodiment

Figure 17:
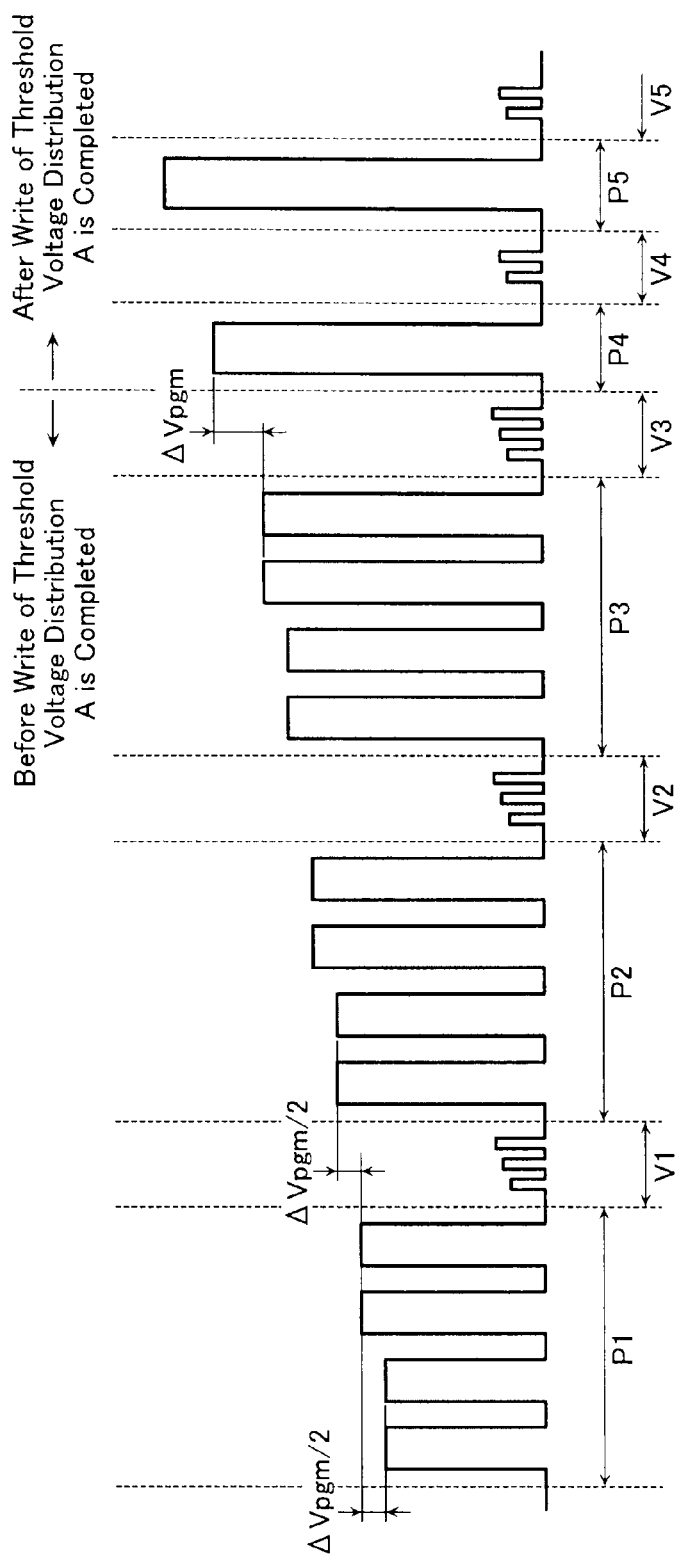
FIG. 17 is a view showing operation of a nonvolatile semiconductor memory device according to a third embodiment.

Next, a third embodiment of the present invention is described with reference to FIG. 17. A configuration of a nonvolatile semiconductor memory device in the present embodiment is similar to that in the first embodiment, hence detailed description thereof is omitted. FIG. 17 is a view showing a state of the write pulse voltage Vpgm applied to the selected word line WL when writing the threshold voltage distribution A in the upper page write operation. The present embodiment differs from the first and second embodiments in the number of times that the write pulse voltage Vpgm is applied during one time of the write operation, and in timing of the step-up operation of the write pulse voltage Vpgm.

As shown in FIG. 17, in the present embodiment, when performing one time of the write operation in time period P1, a verify operation is performed after four times of applications of the write pulse voltage Vpgm. Values of the first two times of the write pulse voltages Vpgm in time period P1 are set to an initial value Vpgm0. In addition, values of the subsequently applied two times of the write pulse voltages Vpgm are set to voltages which are larger than the initial value Vpgm0 by an amount of half of a certain step-up value ΔVpgm (>0) (refer to FIG. 17).

Subsequently, in time period V1, a write verify operation to read whether the threshold voltage distribution A, B, or C is written or not is performed. When a write-insufficient memory cell MC exists, a step-up operation increasing the write pulse voltage Vpgm by a further amount of a voltage ΔVpgm/2 is performed.

When the write operation is executed in time period P2, the first two times of the write pulse voltages Vpgm are set to a voltage Vpgm0+ΔVpgm. The difference in voltage between the write pulse voltage Vpgm initially applied in time period P1 and the write pulse voltage Vpgm initially applied in time period P2 is set to the certain step-up value ΔVpgm. The verify operation is performed after multiple times (four times in the example shown in FIG. 17) of applications of the write pulse voltage Vpgm also in time period P2. Values of the first two times of the write pulse voltages Vpgm in time period P2 are set to the voltage Vpgm0+ΔVpgm. Moreover, values of the subsequently applied two times of the write pulse voltages Vpgm are set to voltages which are larger than the value of the voltage Vpgm0+Vpgm by an amount of half of the certain step-up value ΔVpgm (>0) (refer to FIG. 17).

Thereafter, the write operation and write verify operation are repeated until data write is completed.

In the write operations in time periods P4 and P5 after it is determined by the write verify operation of time period V3 that the threshold voltage distribution A is written to the selected memory cell MC, one time of the write pulse voltage Vpgm is applied. In time periods V4 and V5, a verify operation of another threshold voltage distribution (for example, threshold voltage distribution B or C) is executed. In write operations after it is determined that the threshold voltage distribution A is written to the selected memory cell MC, a step-up operation stepping up the write pulse voltage Vpgm by the certain step-up value ΔVpgm is performed.

[Advantages]

The write operation in the present embodiment, when repeating a write cycle, that is, when repeating application of the write pulse voltage Vpgm and the verify operation, also performs application of the write pulse voltage Vpgm multiple times, and then performs the verify operation. Executing the write operation of the present embodiment enables a significant rise in the threshold voltage to be prevented, even in the case of a peculiar memory cell MC. Therefore, the write operation in the present embodiment makes it possible to suppress the peculiar cell action that, subsequent to continuation of a state where almost no change in threshold voltage can be seen, the threshold voltage changes greatly, and suppress spread of the write threshold voltage distribution width.

Now, the write operation in the present embodiment includes an operation applying write pulse voltages Vpgm of an identical voltage value. However, provided that the finally applied voltage value of the write pulse voltage Vpgm in one time of the write operation is set to be larger than the initially applied voltage value of the write pulse voltage Vpgm in one time of the write operation, change in the threshold voltage of the peculiar cell can be suppressed, even if an operation applying write pulse voltages Vpgm of an identical voltage value is included. Moreover, the lack of need to finely control the voltage value on each application of the write pulse voltage Vpgm makes it easy to carry out the write operation.

Fourth Embodiment

Figure 18:
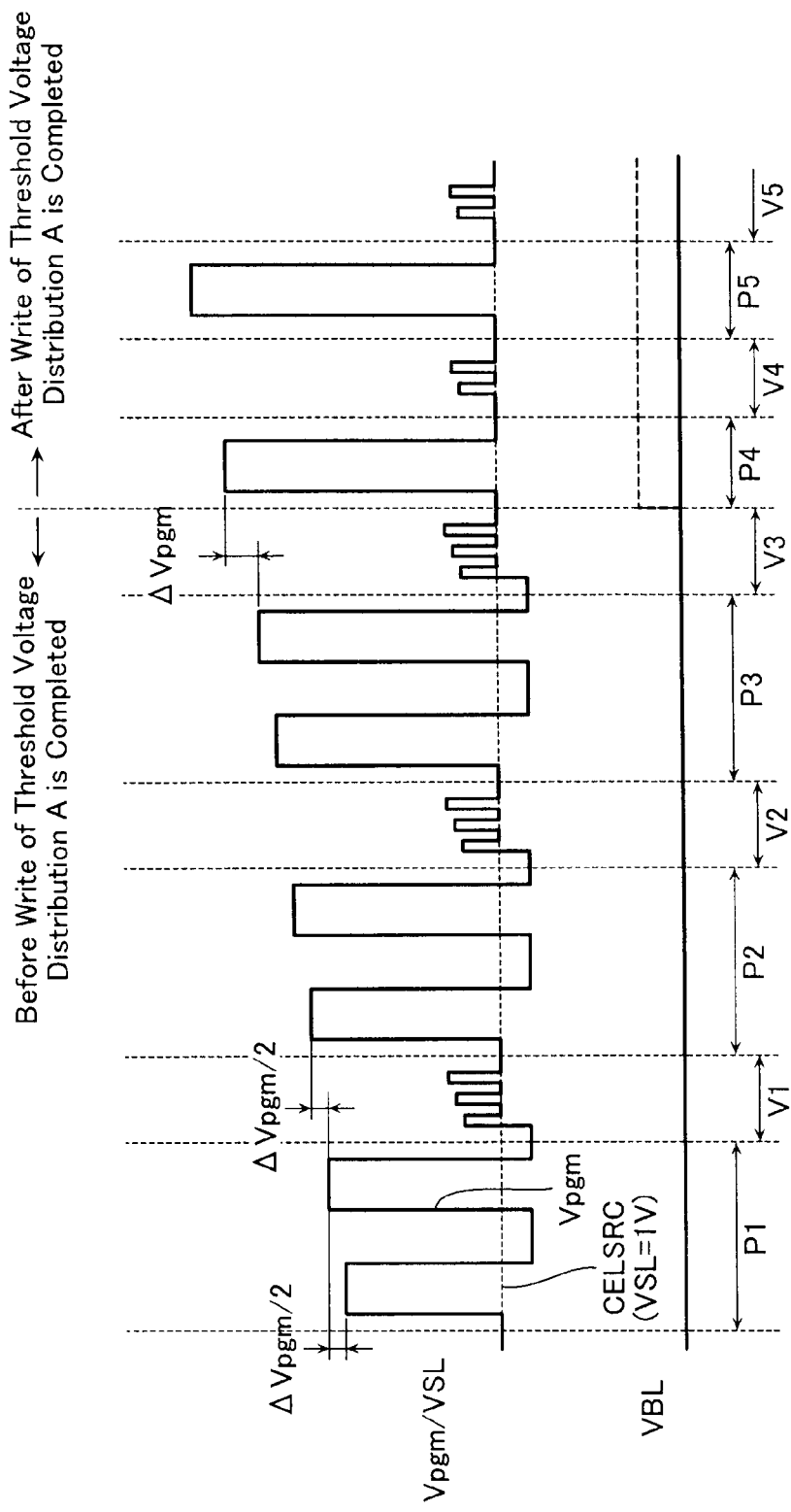
FIG. 18 is a view showing operation of a nonvolatile semiconductor memory device according to a fourth embodiment.

Next, a fourth embodiment of the present invention is described with reference to FIG. 18. In a nonvolatile semiconductor memory device in the present embodiment, the control circuit 6 is configured to, when multiple write pulse voltages are applied/suspended, enable a voltage value during lowering of the write pulse voltage Vpgm to be set lower than a voltage value of a voltage VSL applied to the common source line CELSRC. FIG. 18 is a view showing a state of the write pulse voltage Vpgm applied to the selected word line WL, the voltage VSL applied to the common source line CELSRC, and a voltage VBL applied to the bit line BL, when writing the threshold voltage distribution A. The present embodiment is similar to the first embodiment in the number of times that the write pulse voltage Vpgm is applied during one time of the write operation, and in the step-up value of the write pulse voltage Vpgm.

As shown in FIG. 18, in the present embodiment, the voltage value at a time when the write pulse voltage Vpgm is being suspended in time periods P1, P2, and P3 that the write operation is performed, that is, when the voltage is being lowered, is lowered to a voltage value which is less than a voltage value of the voltage VSL applied to the common source line CELSRC. For example, the voltage value of the common source line CELSRC is set to 1 V, and the voltage value of the write pulse voltage Vpgm when falling is set to ground voltage.

Subsequently, in time period V1, a write verify operation to read whether the threshold voltage distribution A, B, or C is written or not is performed. When a write-insufficient memory cell MC exists, a step-up operation increasing the write pulse voltage Vpgm by a further amount of a voltage ΔVpgm/2 is performed.

Thereafter, the write operation and write verify operation are repeated until data write is completed. In the write operations of time periods P1, P2, and P3, the voltage value of the write pulse voltage Vpgm when falling is set lower than the voltage value of the voltage VSL applied to the common source line CELSRC.

In the write operations in time periods P4 and P5 after it is determined by the write verify operation of time period V3 that the threshold voltage distribution A is written to the selected memory cell MC, one time of the write pulse voltage Vpgm is applied. In time periods V4 and V5, a verify operation of another threshold voltage distribution (for example, threshold voltage distribution B or C) is executed. In write operations after it is determined that the threshold voltage distribution A is written to the selected memory cell MC, a step-up operation stepping up the write pulse voltage Vpgm by the certain step-up value ΔVpgm is performed. In addition, the voltage VBL of the bit line BL corresponding to the selected memory cell MC written with the threshold voltage distribution A is raised to prevent a write operation to that memory cell MC from occurring. In the write operations of time periods P4 and P5, the voltage value of the write pulse voltage Vpgm when falling is set to be identical to the voltage value of the voltage VSL applied to the common source line CELSRC.

[Advantages]

The write operation in the present embodiment, when repeating a write cycle, that is, when repeating application of the write pulse voltage Vpgm and the verify operation, also performs application of the write pulse voltage Vpgm multiple times while stepping up the voltage value, and then performs the verify operation. Furthermore, in the write operation, the voltage value of the write pulse voltage Vpgm when falling is set lower than the voltage value of the voltage VSL applied to the common source line CELSRC. Executing this write operation of the present embodiment enables a significant rise in the threshold voltage of a peculiar memory cell MC to be effectively prevented. Therefore, the write operation in the present embodiment makes it possible to suppress the peculiar cell action that, subsequent to continuation of a state where almost no change in threshold voltage can be seen, the threshold voltage changes greatly, and suppress spread of the write threshold voltage distribution width.

Fifth Embodiment

Figure 19:
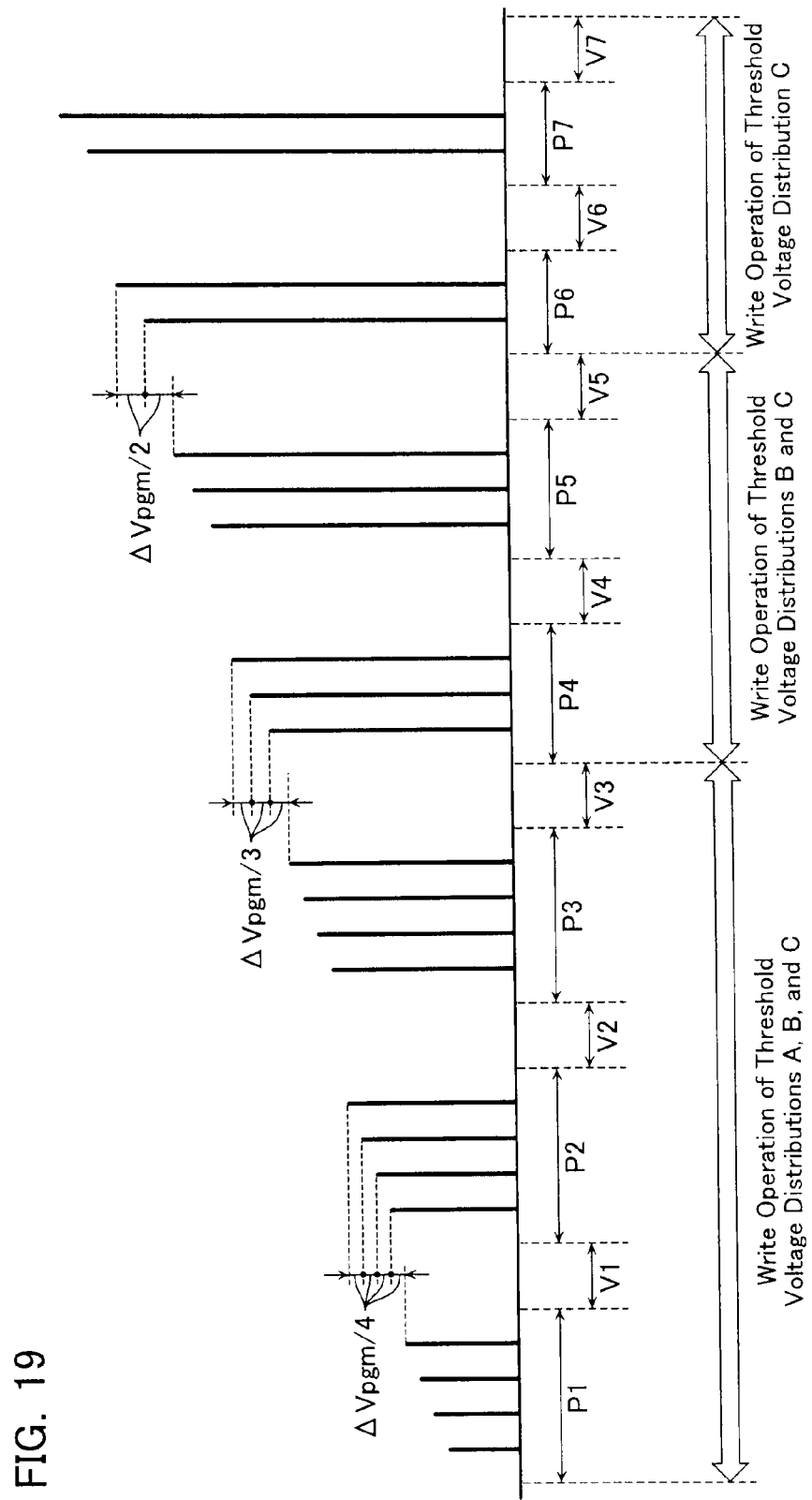
FIG. 19 is a view showing operation of a nonvolatile semiconductor memory device according to a fifth embodiment.

Next, a fifth embodiment of the present invention is described with reference to FIGS. 19 and 20. A configuration of a nonvolatile semiconductor memory device in the present embodiment is similar to that in the first embodiment, hence detailed description thereof is omitted. FIG. 19 is a view showing a state of the write pulse voltage Vpgm applied to the selected word line WL when executing the upper page write operation. The above-mentioned first through fourth embodiments described examples of executing a write operation including multiple times of applications of the write pulse voltage Vpgm on a memory cell having a voltage of the threshold voltage distribution to be provided that is lower than a certain value (for example, threshold voltage distribution A). The present embodiment differs from the above-mentioned embodiments in applying the write pulse voltage Vpgm multiple times and stepping up the write pulse voltage Vpgm in write operations for each of the threshold voltage distributions A, B, and C. More specifically, the number of times of applications of the write pulse voltage Vpgm during a write operation of the threshold distribution A is set to N times and a step-up width set to ΔVpgm/N, the number of times of applications of the write pulse voltage Vpgm during a write operation of the threshold distribution B is set to M times and a step-up width set to ΔVpgm/M, and the number of times of applications of the write pulse voltage Vpgm during a write operation of the threshold distribution C is set to L times and a step-up width set to ΔVpgm/L, where N≧M≧L.

The write operation in the present embodiment is described below with reference to a flowchart shown in FIG. 20. First, when the write operation is started in step S1, write data is loaded to the data register 3b (FIG. 1) from external (step S2).

Next, write operations of the threshold voltage distributions A, B, and C are executed based on the write data (step S3). In the write operations of the threshold voltage distributions A, B, and C herein, the write pulse voltage Vpgm is applied N times (four times in the example shown in FIG. 19), and stepped up in increments of the voltage ΔVpgm/N. Then, a write verify operation to read whether the threshold voltage distributions A, B, and C are written or not is performed (steps S5, S7, and S9). Verify voltages in each of the verify operations are lower limit values VA, VB, and VC of the threshold voltage distributions A, B, and C (refer to FIG. 8). Then, in the verify operation, it is determined whether the threshold voltage distribution A is written to the selected memory cell MC or not (step S10). When the threshold voltage distribution A is not written to the selected memory cell MC, the write operation (step S3) and write verify operation (steps S5, S7, and S9) are repeated until data write is completed. In time periods P1, P2, and P3, and time periods V1, V2, and V3 in FIG. 19, the write operation and write verify operation are repeatedly executed.

When it is determined that the threshold voltage distribution A is written to the selected memory cell MC, the write operations of the threshold voltage distributions B and C are executed (step S3). In the write operations of the threshold voltage distributions B and C herein, the write pulse voltage Vpgm is applied M times (three times in the example shown in FIG. 19), and stepped up in increments of the voltage ΔVpgm/M. Then, a write verify operation to read whether the threshold voltage distributions B and C are written or not is performed (steps S7 and S9). Verify voltages in each of the verify operations are lower limit values VB and VC of the threshold voltage distributions B and C (refer to FIG. 8). Note that the write verify operation to read whether the threshold voltage distribution A is written or not is skipped (step S4). Then, in the verify operation, it is determined whether the threshold voltage distribution B is written to the selected memory cell MC or not (step S11). When the threshold voltage distribution B is not written to the selected memory cell MC, the write operation (step S3) and write verify operation (steps S7 and S9) are repeated until data write is completed. In time periods P4 and P5, and time periods V4 and V5 in FIG. 19, the write operation and write verify operation are repeatedly executed.

A write operation is executed by a similar sequence also for the threshold voltage distribution C. Note that in the write operation of the threshold voltage distribution C, the write pulse voltage Vpgm is applied L times (two times in the example shown in FIG. 19), and stepped up in increments of the voltage ΔVpgm/L. When it is determined in step S12 that all data is written, the write operation ends (step S13).

[Advantages]

The write operation in the present embodiment, when repeating a write cycle, that is, when repeating application of the write pulse voltage Vpgm and the verify operation, also performs application of the write pulse voltage Vpgm multiple times while stepping up the voltage value, and then performs the verify operation. Executing the write operation of the present embodiment enables a significant rise in the threshold voltage to be prevented, even in the case of a peculiar memory cell MC. Therefore, the write operation in the present embodiment makes it possible to suppress the peculiar cell action that, subsequent to continuation of a state where almost no change in threshold voltage can be seen, the threshold voltage changes greatly, and suppress spread of the write threshold voltage distribution width.

In the write operation in the present embodiment, performing applications of the write pulse voltage Vpgm multiple times while stepping up the voltage value in write operations for all of the threshold voltage distributions allows spread of distribution width in all of the threshold voltage distributions to be suppressed.

[Other]

This concludes description of the embodiments of the present invention, but it should be noted that the present invention is not limited to the above-described embodiments, and that various alterations, additions, combinations, and so on, are possible within a range not departing from the scope and spirit of the invention. For example, the above-mentioned embodiments perform application of the write pulse voltage Vpgm multiple times while stepping up the voltage value and then perform the verify operation in an upper page write operation after lower page data is written. However, the present invention is not limited to this lower page write/upper page write operation, and may also be applied when executing a write operation in the two stages of a foggy write operation which is a rough write of upper page data/lower page data, and a fine write operation which is an accurate write of upper page data/lower page data. At this time, the operation to perform application of the write pulse voltage Vpgm multiple times while stepping up the voltage value and then perform the verify operation may be executed during the fine write operation which is an accurate write of upper page data/lower page data.

In addition, the above-mentioned embodiments are described assuming that data stored in the memory cells MC is four-value data. However, the memory cells MC may also be configured to store two-value data having the two threshold voltage distributions of a write state and an erase state or multi-value data (for example, eight-value data) in which the threshold voltage distributions are even more finely divided.

Furthermore, it goes without saying that the present invention is not limited to application to a NAND type flash memory and is also applicable to other nonvolatile semiconductor devices such as NOR type that include memory cells having a charge storage layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a plurality of memory cells each having a charge storage layer formed on a channel region of a semiconductor substrate via a first insulating film and a control electrode formed on the charge storage layer via a second insulating film, and each configured capable of being written with multi-value data such that a threshold voltage of the memory cell is included in a threshold voltage distribution indicating an erase state or any of threshold voltage distributions of multiple kinds of write states;
    a memory cell array having the memory cells arranged therein; and
    a control unit configured to execute a write cycle multiple times, the write cycle including a write operation and a write verify operation, the write operation being an operation for applying at least one write pulse voltage to the control electrode selected for data write, and the write verify operation being an operation for determining whether data write is completed or not,
    when a voltage of the threshold voltage distribution to be provided to the memory cell is lower than a certain value, during the write cycles, the control unit controlling the write operation to apply the write pulse voltage multiple times, and make a voltage value of a finally applied write pulse voltage larger than a voltage value of an initially applied write pulse voltage, and
    when a voltage of the threshold voltage distribution to be provided to the memory cell is a certain value or more, during the write cycles, the control unit controlling the write operation to apply the write pulse voltage one time, and make a voltage value of the write pulse voltage larger on the write cycle basis.

2. The nonvolatile semiconductor memory device according to claim 1, wherein
    when a voltage of the threshold voltage distribution to be provided to the memory cell is lower than a certain value, during the one time of the write operation, the control unit applies multiple write pulse voltages such that the voltage value rises sequentially by a certain step-up width at a time.

3. The nonvolatile semiconductor memory device according to claim 2, wherein
    when a voltage of the threshold voltage distribution to be provided to the memory cell is lower than a certain value, and when the number of times of applications of the write pulse voltage is set to N, the control unit sets the step-up width of the multiple write pulse voltages to 1/N times the step-up width of the write pulse voltage between one write operation and a next write operation.

4. The nonvolatile semiconductor memory device according to claim 3, wherein
    the number of times of applications N of the write pulse voltage is set to a number not less than two and not more than eight.

5. The nonvolatile semiconductor memory device according to claim 1, wherein
    when a voltage of the threshold voltage distribution to be provided to the memory cell is lower than a certain value, during the one time of the write operation, the control unit applies multiple write pulse voltages to include an operation for applying the write pulse voltage having an identical voltage value.

6. The nonvolatile semiconductor memory device according to claim 1, wherein
    the control unit is configured to execute the data write by two times of the write operation which are an upper page data write operation based on upper page data and a lower page data write operation based on lower page data, and
    to execute the write operation including application of multiple times of the write pulse voltages during the upper page data write operation.

* * * * *